(12) United States Patent
Cote (10) Patent No.: US 11,614,487 B2
(45) Date of Patent: Mar. 28, 2023

(54) MULTI-CAPTURE AT-SPEED SCAN TEST BASED ON A SLOW CLOCK SIGNAL

(71) Applicant: Siemens Industry Software Inc., Plano, TX (US)

(72) Inventor: Jean-Francois Cote, Davie, FL (US)

(73) Assignee: Siemens Industry Software Inc., Plano, TX (US)

(*) Notice: Subject to any disclaimer, the term of this patent is extended or adjusted under 35 U.S.C. 154(b) by 107 days.

(21) Appl. No.: 17/311,868

(22) PCT Filed: Jan. 28, 2020

(86) PCT No.: PCT/US2020/015285
§ 371 (c)(1),
(2) Date: Jun. 8, 2021

(87) PCT Pub. No.: WO2020/159900
PCT Pub. Date: Aug. 6, 2020

(65) Prior Publication Data
US 2022/0018902 A1 Jan. 20, 2022

Related U.S. Application Data

(60) Provisional application No. 62/798,530, filed on Jan. 30, 2019.

(51) Int. Cl.
*G01R 31/3185* (2006.01)

(52) U.S. Cl.
CPC ........... *G01R 31/318594* (2013.01); *G01R 31/318544* (2013.01); *G01R 31/318552* (2013.01); *G01R 31/318555* (2013.01); *G01R 31/318527* (2013.01)

(58) Field of Classification Search
CPC .... G01R 31/318594; G01R 31/318544; G01R 31/318552; G01R 31/318555; G01R 31/318527
See application file for complete search history.

(56) References Cited

U.S. PATENT DOCUMENTS

| | | | |
|---|---|---|---|
| 7,260,756 | B1 | 8/2007 | Wang et al. |
| 8,375,265 | B1 * | 2/2013 | Venkatasubramanian ................... G01R 31/31858 714/731 |
| 2002/0120896 | A1 | 8/2002 | Wang et al. |

(Continued)

OTHER PUBLICATIONS

X.-X. Fan, Y. Hu and L.-T. Wang, "An On-Chip Test Clock Control Scheme for Multi-Clock At-Speed Testing," 16th Asian Test Symposium (ATS 2007), 2007, (Year: 2007).*

(Continued)

*Primary Examiner* — Cynthia Britt (57) ABSTRACT

A circuit comprises a plurality of clock control devices. Each of the clock control devices is configured to generate a scan test clock signal for a particular clock domain in the circuit and comprises circuitry configured to select clock pulses of a fast clock signal as scan capture clock pulses for the particular clock domain based on a particular clock pulse of a slow clock signal and a scan enable signal. The order and spacing between the groups of the scan capture clock pulses for different clock domains correspond to the order and spacing of the clock pulses of the slow clock signal.

20 Claims, 6 Drawing Sheets

(56) References Cited

U.S. PATENT DOCUMENTS

| | | |
|---|---|---|
| 2011/0264971 A1* | 10/2011 | Bahl .............. G01R 31/318594 |
| | | 714/E11.155 |
| 2012/0102376 A1* | 4/2012 | Shtulman ....... G01R 31/318594 |
| | | 714/E11.02 |
| 2012/0124423 A1 | 5/2012 | Chakravadhanula et al. |
| 2012/0173943 A1 | 7/2012 | Cesari |
| 2015/0137862 A1 | 5/2015 | Bahl et al. |

OTHER PUBLICATIONS

PCT International Search Report and Written Opinion of International Searching Authority dated May 15, 2020 corresponding to PCT International Application No. PCT/US2020/015285 filed Jan. 28, 2020.

Laung-Terng Wang et al., "Using Launch-on-Capture for Testing BIST Designs Containing Synchronous and Asynchronous Clock Domains," IEEE Transactions on Computer-Aided Design of Integrated Circuits and Systems, vol. 29, No. 2, Feb. 2010, pp. 299-312.

Shianling Wu et al., "Using Launch-on-Capture for Testing Scan Designs Containing Synchronous and Asynchronous Clock Domains," IEEE Transactions On Computer-Aided Design of Integrated Circuits and Systems, vol. 30, No. 3, Mar. 2011, pp. 455-463.

* cited by examiner

MULTI-CAPTURE AT-SPEED SCAN TEST BASED ON A SLOW CLOCK SIGNAL

RELATED APPLICATIONS

This application claims the benefit of U.S. Provisional Patent Application No. 62/798,530, filed on Jan. 30, 2019, which application is incorporated entirely herein by reference.

FIELD OF THE DISCLOSED TECHNIQUES

The presently disclosed techniques relates to clock control and generation for scan test. Various implementations of the disclosed techniques may be particularly useful for at-speed scan test of circuits having multiple clock domains.

BACKGROUND OF THE DISCLOSED TECHNIQUES

An integrated circuit often takes multiple steps to perform a function and uses an electrical signal known as a "system clock" to pace how quickly each of these steps is performed. The higher the frequency of the system clock pulses, the faster the integrated circuit will operate. A clock (also referred to as "a clock signal") has a period that specifies the duration of a repeated high and low pattern. The period is inversely related to the clock frequency. The duty cycle of the clock is the ratio of high to low time in the period, usually 50%.

An integrated circuit can have multiple system clocks for simultaneously performing multiple tasks. Different system clocks can control different portions or regions of an integrated circuit. Such regions are referred to as clock domains. As integrated circuits grow to include billions of transitions, it is virtually impossible to design them flat (with no partitioning). Electronic Design Automation (EDA) tools would not be able to process them efficiently. Additionally, there is significant reuse of Intellectual Property (IP) from one design to another. Large designs, known as Systems-On-A-Chip (SOCs), include a large number of "cores" that are used as building blocks (also referred to circuit blocks). Each core can have one or more clock domains.

Circuit defects are unavoidable no matter whether the manufacturing process is at the prototype stage or the high-volume manufacturing stage. It is thus necessary to test chips during the manufacturing process. Structural testing attempts to ascertain that the circuit-under-test has been assembled correctly from some low-level building blocks as specified in a structural netlist and that these low-level building blocks and their wiring connections have been manufactured without defect. Scan testing is the most common technique of structural testing. Under this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits.

Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode. Shift clock pulses and capture clock pulses can be derived from a system clock signal or supplied from the tester. To reduce power dissipation, the frequency of shift clock pulses is often kept lower than the system clock signal, for example, a frequency between 20 MHz and 100 MHz vs. several GHz.

Traditionally, each clock domain is tested one at a time, allowing reliable test patterns to be generated. The drawback is, however, that a large number of test patterns are needed as each clock domain requires a set of test patterns. This significantly increases overall test time. Another approach is to apply simultaneous capture clock signals to multiple clock domains. While test time is reduced, this approach can lead to test coverage loss because data propagating across clock domains are marked as unknown values during test pattern generation. The above two approaches also cannot be used to detect inter-clock-domain faults.

Figure 1:
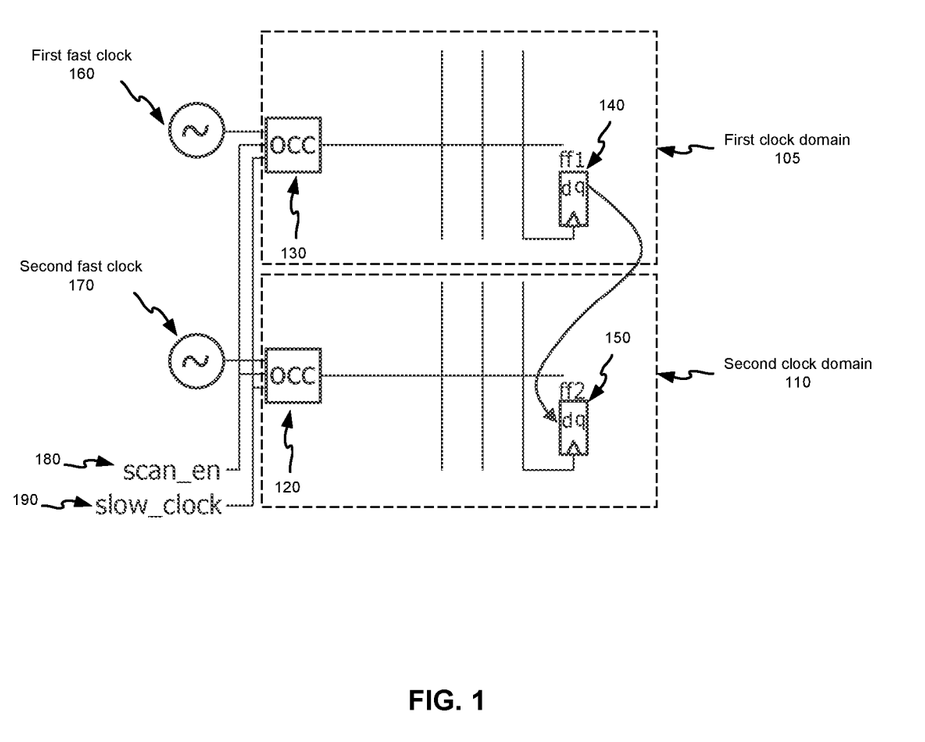
FIG. 1 illustrates an example of an architecture for scan testing two clock domains with cross-domain signals.

To speed up scan test without affecting fault coverage and/or to detect inter-clock-domain faults, capture pulses for multiple clock domains need to be applied in sequence, allowing enough time for a cross-domain signal to reach their destination such as state elements in a different clock domain. FIG. 1 illustrates an example of an architecture for scan testing two clock domains with cross-domain signals. In the figure, two clock domains 105 and 110 have at least one cross-domain signal: a signal traveling from a flip-flop 140 in the clock domain 105 to a flip-flop 150 in the clock domain 110. Each clock domain has an on-chip clock controller (OCC): OCC 130 in the clock domain 105 and OCC 120 in the clock domain 110. The OCC 130 can be configured to generate capture clock pulses for the first clock domain based on a first fast clock 160, a scan enable signal 180 and a slow clock 190, while the OCC 120 can be configured to generate capture clock pulses for the second clock domain based on a second fast clock 170, the scan enable signal 180 and the slow clock 190. To achieve a low test pattern count while maintaining test coverage and/or to detect inter-clock-domain faults, the capture clock pulses generated by the OCC 120 should be delayed from the capture clock pulses generated by the OCC 130 long enough to allow at least the cross-domain signal to travel from the flip-flop 140 to the flip-flop 150 or vice versa. This approach is often referred to as multi-capture, staggered capture, or ordered capture scan test.

Staggered capture have been reported for low-speed scan testing designs containing multiple clock domains. To test static stuck-at faults, capture pulses can be generated directly from a slow clock, so capture pulses for different clock domains can be arranged in sequence readily without clock skew effects. Test patterns for low-speed scan test, however, typically only account for less than 20% of the total test data volume while the rest is for at-speed transition scan test. Synchronizing at-speed capture clock pulses to space them properly in time is just too challenging to realize staggered capture for at-speed scan test. As a result, only one interacting clock domain group could be tested within a given scan load, resulting in a large number of transition test patterns for at-speed scan test.

A paper by Wang et al., "Using Launch-on-Capture for Testing BIST Designs Containing Synchronous and Asynchronous Clock Domains," IEEE Transactions On Computer-Aided Design Of Integrated Circuits And Systems, Vol. 29, No. 2, February 2010, proposes a staggered capture method for at-speed scan test, which is based on using capture clock pulses in one clock domain to trigger the generation of capture clock pulses in another clock domain. This daisy-chain clock-triggering technique can be used to reduce pattern counts by testing multiple clock domains together. Cross-clock-domain triggering, however, is not easy to implement. As a result, the industry has not adopted the technique.

BRIEF SUMMARY OF THE DISCLOSED TECHNIQUES

Various aspects of the disclosed technology relate to staggered capture clock pulse generation for testing multiple clock domains in a circuit. In one aspect, there is a circuit, comprising: a first clock control device for a first clock domain, the first clock control device receiving signals comprising a first fast clock signal, a test signal, and a slow clock signal, the first clock control device comprising first circuitry configured to select clock pulses of the first fast clock signal as scan capture clock pulses for the first clock domain based on a first clock pulse of the slow clock signal and the test signal; and a second clock control device for a second clock domain, the second clock control device receiving signals comprising a second fast clock signal, the test signal, and the slow clock signal, the second clock control device comprising second circuitry configured to select clock pulses of the second fast clock signal as scan capture clock pulses for the second clock domain based on a second clock pulse of the slow clock signal and the test signal, wherein the first clock pulse and the second clock pulse are different clock pulses of the slow clock signal.

The circuit may further comprise: a third clock control device in another clock domain, the third clock control device receiving signals comprising a third fast clock signal, the test signal, and the slow clock signal, the third clock control device comprising third circuitry configured to select clock pulses of the third fast clock signal as scan capture clock pulses for the third clock domain based on a third clock pulse of the slow clock signal and the test signal.

The first clock pulse, the second clock pulse and the third clock pulse may be neighboring clock pulses of the slow clock signal: the first clock pulse immediately precedes the second clock pulse, and the second clock pulse immediately precedes the third clock pulse.

The first clock control device may further comprise storage circuitry configured to store location information of the first clock pulse in the slow clock signal, and the second clock control device may further comprise storage circuitry configured to store location information of the second clock pulse in the slow clock signal.

The first fast clock signal may be a system clock signal for the first clock domain. The second fast clock signal may be a system clock signal for the second clock domain. The slow clock signal may be used for scan shift. The test signal may be a scan enable signal.

The first circuitry may comprise a first counter device, the first counter device being clocked by the slow clock signal and configured to change output when a number of clock pulses of the slow clock signal equals a first preset value, and the second circuitry may comprise a second counter device, the second counter device being clocked by the slow clock signal and configured to change output when a number of clock pulses of the slow clock signal equals a second preset value. The first clock control device may further comprise storage circuitry configured to store the first preset value and the second clock control device may further comprise storage circuitry configured to store the second preset value.

The frequency of the slow clock signal may be determined based on time needed for cross-clock-domains signals travel from state elements in the first clock domain to state elements in the second clock domain.

In another aspect, there are one or more non-transitory computer-readable media storing computer-executable instructions for causing one or more processors to perform a method, the method comprising: creating the above circuit in a circuit design for testing a chip fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to staggered capture clock pulse generation for testing multiple clock domains in a circuit. In the following description, numerous details are set forth for the purpose of explanation. However, one of ordinary skill in the art will realize that the disclosed technology may be practiced without the use of these specific details. In other instances, well-known features have not been described in detail to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "select" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Figure 2:
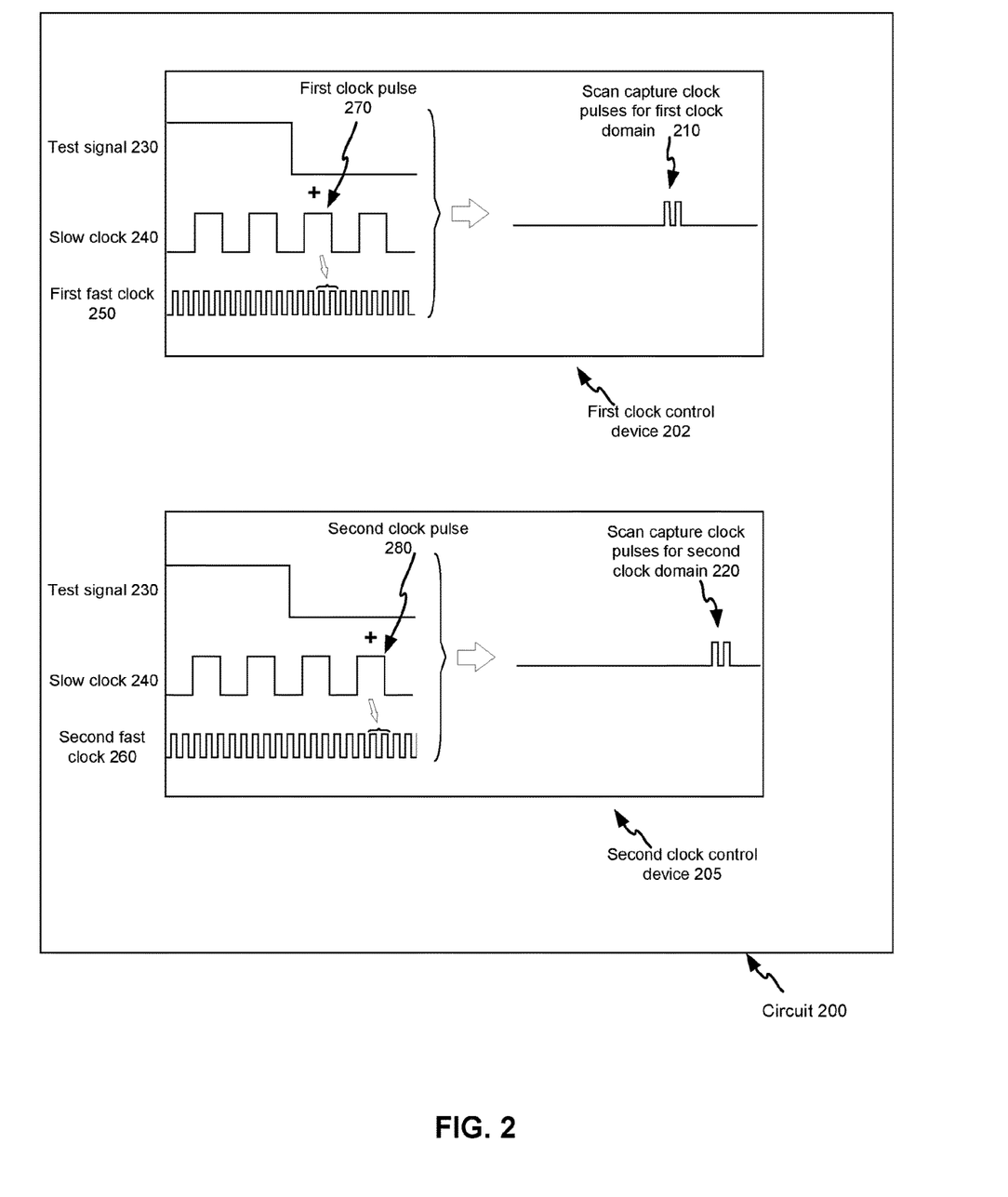
FIG. 2 illustrates an example of a circuit comprising two on-chip clock control (OCC) devices with timing waveforms which are implemented according to various embodiments of the disclosed technology.

FIG. 2 illustrates an example of a circuit 200 comprising two on-chip clock control (OCC) devices (a first clock control device 202 and a second clock control device 205) implemented according to various embodiments of the disclosed technology. The first clock control device 202 receives signals comprising a first fast clock signal 250, a test signal 230, and a slow clock signal 240, and is configurable to generate a clock signal for scan testing a first clock domain (not shown in the figure). The first clock control device 202 comprises circuitry configurable to select clock pulses of the first fast clock signal 250 as scan capture clock pulses 210 for the first clock domain based on a first clock pulse 270 of the slow clock signal 240 and the test signal 230. Similarly, the second clock control device 205 receives signals comprising a second fast clock signal 260, the test signal 230, and the slow clock signal 240, and is configurable to generate a clock signal for scan testing a second clock domain (not shown in the figure). The second clock control device 205 comprises circuitry configurable to select clock pulses of the second fast clock signal 260 as scan capture clock pulses 220 for the second clock domain based on a second clock pulse 280 of the slow clock signal 240 and the test signal 230. It should be noted the figure is for illustration and does not reflect the actual sizes of the devices 202 and 205 relative to that of the circuit 200.

The test signal 230 can be a scan enable signal. Scan testing is in the shift mode when the scan enable signal is asserted (at "1") and in the capture mode when the scan enable signal is de-asserted (at "0"), or vice versa. The first fast clock signal 250 and the second fast clock signal 260 may be system clock signals. System clock signals can be derived from a reference clock signal using phase-locked loop circuitry. The slow clock signal 240 may be supplied by a tester. The slow clock signal 240 can be used to derive scan shift pulses based on the test signal 230. The shift pulses and the capture pulses such as the scan capture clock pulses 210 or the scan capture clock pulses 220 can be combined into a clock signal to drive scan cells in a particular clock domain for scan testing. The slow clock signal 240 can also be used to derive capture pulses for slow capture as compared to at-speed capture.

In FIG. 2, the scan capture clock pulses 210 and the scan capture clock pulses 220 can be treated as being triggered by the first clock pulse 270 and the second clock pulse 280, respectively. Adjusting the clock frequency of the slow clock signal 240 changes the spacing between the scan capture clock pulses 210 and the scan capture clock pulses 220. This can be used to obtain a desired delay of the scan capture clock pulses 220 from the scan capture clock pulses 210, which can be long enough for cross-domain signals to reach their destination. While the first clock pulse 270 and the second clock pulse 280 are neighboring clock pulses, clock pulses not next to each other in the slow clock signal 240 can also be used as the triggering events to the scan capture clock pulses 210 and 220.

A person of ordinary skill in the art should appreciate that the disclosed technology can be applied to staggered capture clock pulse generation for more than two clock domains. For example, the circuit 200 in FIG. 2 may have a third clock domain and a third clock control device. The third clock control device can use a clock pulse of the slow clock signal 240 (not shown in the figure) immediately after the second clock pulse 280 to select clock pulses in the system clock signal as scan capture clock pulses for the third clock domain. As such, one set of at-speed test patterns can be generated for a multi-capture (staggered capture) test of the three time domains in the circuit 220, shortening the overall test time while maintaining or even enhancing (by targeting cross-domain faults) test coverage.

Figure 3:
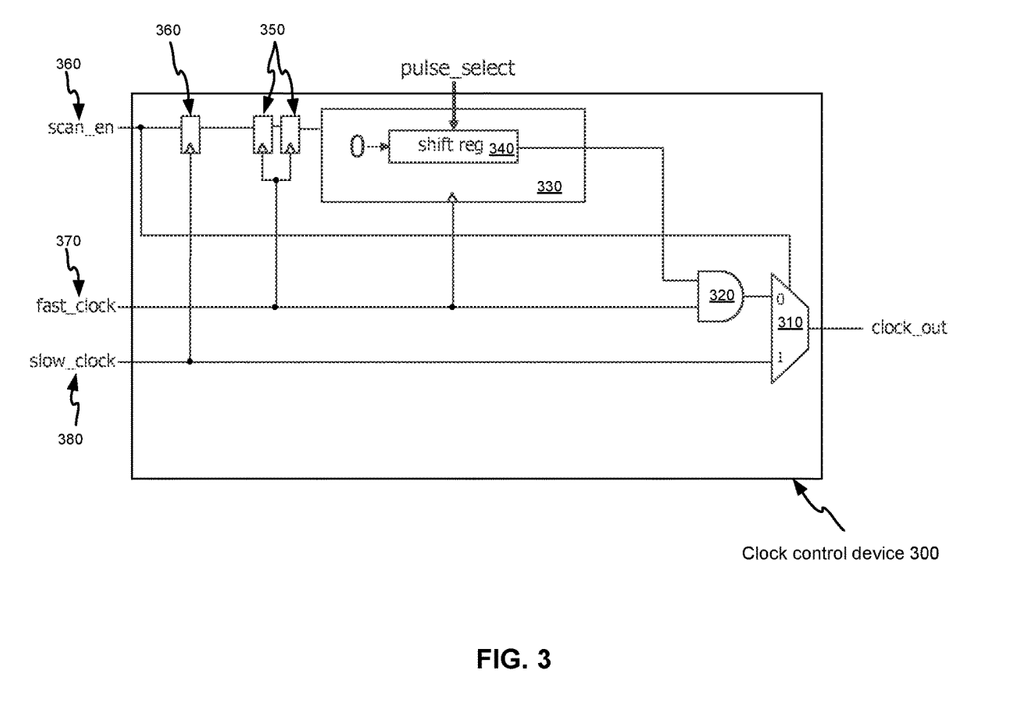
FIG. 3 illustrates an example of a block diagram for a part of or a whole of a conventional clock control device.

A conventional on-chip clock control device can be configured to perform functions such as clock selection (based on test type, frequency, and other criteria), clock pulse suppression; and clock gating. FIG. 3 illustrates an example of a block diagram for a part of or a whole of a conventional clock control device 300. The clock control device 300 comprises a multiplexer 310, an AND gate 320, a device 330, a pair of flip-flops 350, and a flip-flop 360. The multiplexer 310 can select, based on a scan enable signal 360, clock pulses of a slow clock signal 380 for scan shift and clock pulses of a fast clock signal 370 for scan capture. The device 330 is configured to generate a signal to suppress, through the AND gate 320, clock pulses of the fast clock signal 370 except a predetermined number of pulses. The surviving pulses can serve as capture pulses. The pair of flip-flops 350, clocked by the fast clock signal 370, are used to synchronize the scan enable signal 360 with the fast clock signal 370. Here, the output of the two flip-flops 350 is referred to as synchronized capture trigger signal. The synchronized capture trigger signal can be used to gate the fast clock signal 370 supplied to the device 330. The gated fast clock signal 370 clocks a shift register 340 in the device 330. The shift register 340 can be preloaded with data determining how many pulses of the fast clock signal 370 would pass through the AND gate 320 to serve as capture pulses.

The flip-flop 360 is clocked by the slow clock signal 380, ensuring the scan enable signal 360 is not synchronized by the fast clock signal 370 until the slow clock signal 380 is pulsed. This can reduce the risk of a clock race condition. Here, the output of the flip-flop 360 is referred to as capture trigger signal.

Figure 4:
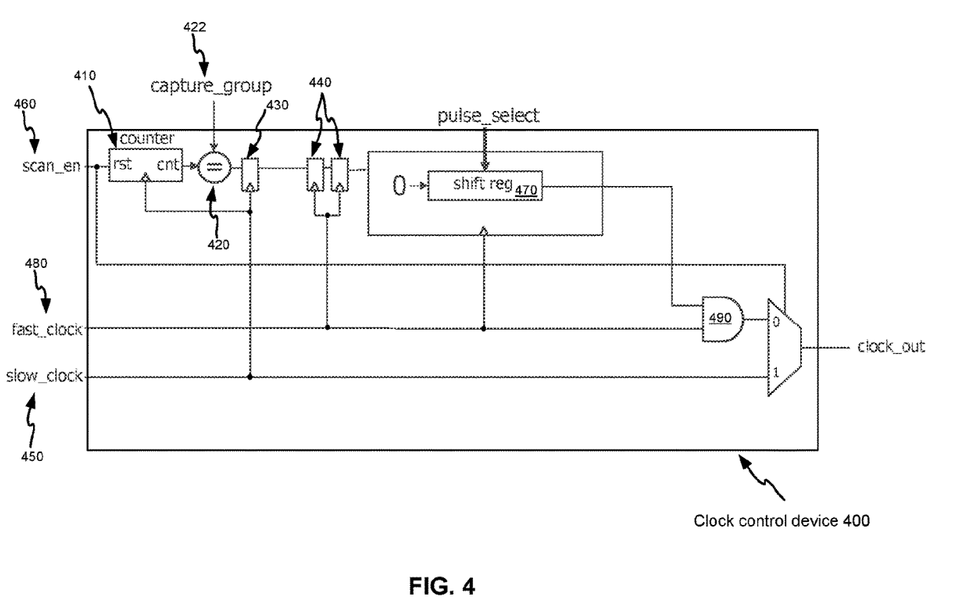
FIG. 4 illustrates an example of a block diagram for a part of or a whole of a clock control device implemented according to various embodiments of the disclosed technology.

FIG. 4 illustrates an example of a block diagram for a part of or a whole of a clock control device 400 implemented according to various embodiments of the disclosed technology. The clock control device 400 is similar to the conventional clock control device 300 except for two additional devices placed in front of a flip-flop (430 in FIG. 4, 360 in FIG. 3): a counter 410 and a comparator 420. The counter 410 is driven by a slow clock signal 450, which also clocks the flip-flop 430. A scan enable signal 460 resets the counter 410 at the onset of the capture mode and then the counter 410 starts to increment on each clock pulse of the slow clock signal 450. The comparator 420 compares the clock pulse number output by the counter 410 with a preset value ("capture group", 422) representing which pulse of the slow clock signal is used to trigger capture pulses for the particular clock domain. This value 422 may be stored in a register in the clock control device 400. When the output of the counter 410 equals the value 422, the comparator 420 changes its output, which in turn triggers the generation of capture pulses for the particular clock domain. Like the shift register 340 in FIG. 3, a shift register 470 can be preloaded with data determining the number of the capture pulses.

Alternatively, the counter 410 may be set to the value 422 at the onset of the capture mode and start to decrement on each clock pulse of the slow clock signal 450. When the output of the counter 410 equals zero, the comparator 420 changes its output, which in turn triggers the generation of capture pulses for the particular clock domain. While the counter 410 and the comparator 420 are shown as separate devices in FIG. 4, they may be combined into a single device to perform the same function.

Figure 5:
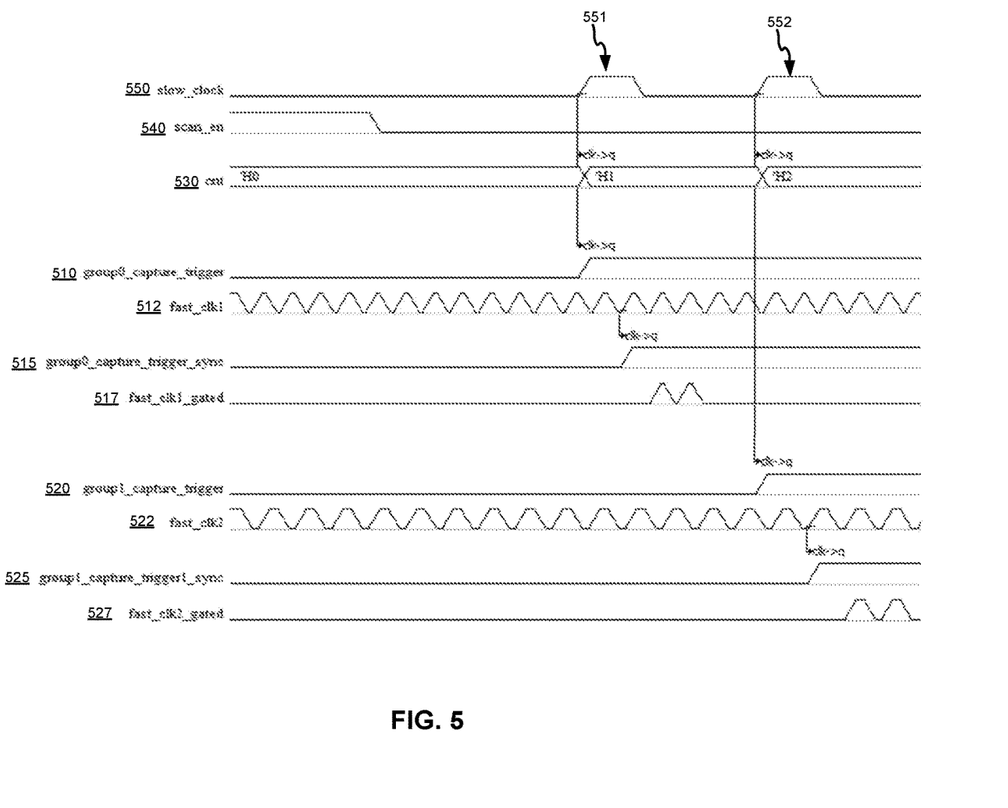
FIG. 5 illustrates an example of waveforms for signals associated with two instances of the clock control device illustrated in FIG. 4, of which each generates a scan clock signal for a specific clock domain.

FIG. 5 illustrates an example of waveforms for signals associated with two instances of the clock control device 400, of which each generates a scan clock signal for a specific clock domain. In the figure, "groupX_capture_trigger" (510, 520) represents a capture trigger signal output by the flip-flop 430; "fast_clkY" (512, 522) represents the fast clock signal 480; "groupX_capture_trigger_sync" (515, 525) represents a synchronized capture trigger signal output by the pair of flip-flops 440; "fast_clkY_gated" (517, 527) represents a signal output by the AND gate 490; "cnt" (530) represents an output signal of the counter 410; "scan_en" (540) represents the scan enable signal 460; and "slow_clock" (550) represents the slow clock signal 460. Here, X=0 and Y=1 are for the first clock domain, while X=1 and Y=2 are for the first clock domain.

For the instance of the clock control device 400 for the first clock domain, the capture trigger signal 510 is not asserted until the counter 410 is advanced by the first clock pulse 551 of the slow clock signal 550. For the instance of the clock control device 400 for the second clock domain, the capture trigger signal 520 is not asserted until the counter 410 is advanced by the second clock pulse 552 of the slow clock signal 550. The capture trigger signals 510 and 520 are then synchronized with the fast clock signal 512 and 522, respectively. The synchronized capture trigger signal 515 helps produce two pulses of the fast_clk1_gated signal 517 after the first clock pulse 551 of the slow clock signal 550 but before the second clock pulse 552 of the slow clock signal 550, while the synchronized capture trigger signal 525 helps produce two pulses of the fast_clk2_gated signal 527 after the second clock pulse 552 of the slow clock signal 550. As such, two staggered groups of capture pulses are generated.

As FIGS. 2, 4-5 show, the disclosed technology does not need cross-domain triggering. The ordered captured pulse groups for different clock domains are derived based on a common slow clock signal. By controlling the separation of the slow clock pulses, skew between the domains can be tolerated without risking timing violations on the inter-domain paths.

Figure 6:
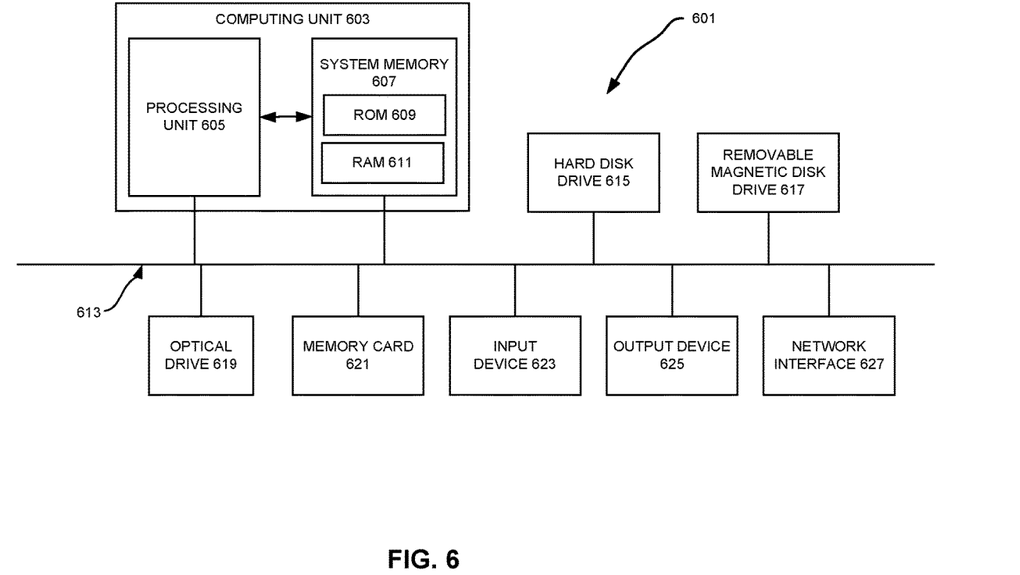
FIG. 6 illustrates a programmable computer system with which various embodiments of the disclosed technology may be employed.

Various examples of the disclosed technology may be implemented through the execution of software instructions by a computing device, such as a programmable computer. For example, the computing device may be caused to perform a method for creating multiple instances of a clock control device such as the clock control device 400 in a circuit design for testing a chip fabricated according to the circuit design. Accordingly, FIG. 6 shows an illustrative example of a computing device 601. As seen in this figure, the computing device 601 includes a computing unit 603 with a processing unit 605 and a system memory 607. The processing unit 605 may be any type of programmable electronic device for executing software instructions, but it will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices. For example, the processing unit 605 or the system memory 607 may be directly or indirectly connected to one or more additional memory storage devices, such as a "hard" magnetic disk drive 615, a removable magnetic disk drive 617, an optical disk drive 619, or a flash memory card 621. The processing unit 605 and the system memory 607 also may be directly or indirectly connected to one or more input devices 623 and one or more output devices 625. The input devices 623 may include, for example, a keyboard, a pointing device (such as a mouse, touchpad, stylus, trackball, or joystick), a scanner, a camera, and a microphone. The output devices 625 may include, for example, a monitor display, a printer and speakers. With various examples of the computer 601, one or more of the peripheral devices 615-625 may be internally housed with the computing unit 603. Alternately, one or more of the peripheral devices 615-625 may be external to the housing for the computing unit 603 and connected to the bus 613 through, for example, a Universal Serial Bus (USB) connection.

With some implementations, the computing unit 603 may be directly or indirectly connected to one or more network interfaces 627 for communicating with other devices making up a network. The network interface 627 translates data and control signals from the computing unit 603 into network messages according to one or more communication protocols, such as the transmission control protocol (TCP) and the Internet protocol (IP). Also, the interface 627 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 601 is illustrated as an example only, and it is not intended to be limiting. Various embodiments of the disclosed technology may be implemented using one or more computing devices that include the components of the computer 601 illustrated in FIG. 6, which include only a subset of the components illustrated in FIG. 6, or which include an alternate combination of components, including components that are not shown in FIG. 6. For example, various embodiments of the disclosed technology may be implemented using a multiprocessor computer, a plurality of single and/or multiprocessor computers arranged into a network, or some combination of both.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
a first clock control device for a first clock domain, the first clock control device receiving signals comprising a first fast clock signal, a test signal, and a slow clock signal, the first clock control device comprising first circuitry configured to select clock pulses of the first fast clock signal as scan capture clock pulses for the first clock domain based on a first clock pulse of the slow clock signal and the test signal; and
a second clock control device for a second clock domain, the second clock control device receiving signals comprising a second fast clock signal, the test signal, and the slow clock signal, the second clock control device comprising second circuitry configured to select clock pulses of the second fast clock signal as scan capture clock pulses for the second clock domain based on a second clock pulse of the slow clock signal and the test signal, wherein the first clock pulse and the second clock pulse are different clock pulses of the slow clock signal.

2. The circuit recited in claim 1, further comprising:
a third clock control device in another clock domain, the third clock control device receiving signals comprising a third fast clock signal, the test signal, and the slow clock signal, the third clock control device comprising third circuitry configured to select clock pulses of the third fast clock signal as scan capture clock pulses for the third clock domain based on a third clock pulse of the slow clock signal and the test signal.

3. The circuit recited in claim 2, wherein the first clock pulse, the second clock pulse and the third clock pulse are neighboring clock pulses of the slow clock signal: the first clock pulse immediately precedes the second clock pulse, and the second clock pulse immediately precedes the third clock pulse.

4. The circuit recited in claim 1, wherein the first clock pulse and the second clock pulse are neighboring clock pulses of the slow clock signal: the first clock pulse immediately precedes the second clock pulse.

5. The circuit recited in claim 1, wherein the first circuitry comprises a first counter device, the first counter device being clocked by the slow clock signal and configured to change output when a number of clock pulses of the slow clock signal equals a first preset value, and the second circuitry comprises a second counter device, the second counter device being clocked by the slow clock signal and configured to change output when a number of clock pulses of the slow clock signal equals a second preset value.

6. The circuit recited in claim 5, wherein the first clock control device further comprises storage circuitry configured to store the first preset value and the second clock control device further comprises storage circuitry configured to store the second preset value.

7. The circuit recited in claim 1, wherein the first fast clock signal is a system clock signal for the first clock domain, the second fast clock signal is a system clock signal for the second clock domain, and the slow clock signal is used for scan shift.

8. The circuit recited in claim 1, wherein the test signal is a scan enable signal.

9. The circuit recited in claim 1, wherein frequency of the slow clock signal is determined based on time needed for cross-clock-domains signals travel from state elements in the first clock domain to state elements in the second clock domain.

10. The circuit recited in claim 1, wherein the first clock control device further comprises storage circuitry configured to store location information of the first clock pulse in the slow clock signal, and the second clock control device further comprises storage circuitry configured to store location information of the second clock pulse in the slow clock signal.

11. One or more computer-readable media storing computer-executable instructions for causing a computer to perform a method, the method comprising:
creating a clock control circuit in a circuit design for testing a chip fabricated according to the circuit design, the clock control circuit comprising:
a first clock control device for a first clock domain, the first clock control device receiving signals comprising a first fast clock signal, a test signal, and a slow clock signal, the first clock control device comprising first circuitry configured to select clock pulses of the first fast clock signal as scan capture clock pulses for the first clock domain based on a first clock pulse of the slow clock signal and the test signal; and
a second clock control device for a second clock domain, the second clock control device receiving signals comprising a second fast clock signal, the test signal, and the slow clock signal, the second clock control device comprising second circuitry configured to select clock pulses of the second fast clock signal as scan capture clock pulses for the second clock domain based on a second clock pulse of the slow clock signal and the test signal.

12. The one or more computer-readable media recited in claim 11, wherein the clock control circuit further comprises:
a third clock control device in another clock domain, the third clock control device receiving signals comprising a third fast clock signal, the test signal, and the slow clock signal, the third clock control device comprising third circuitry configured to select clock pulses of the third fast clock signal as scan capture clock pulses for the third clock domain based on a third clock pulse of the slow clock signal and the test signal.

13. The one or more computer-readable media recited in claim 12, wherein the first clock pulse, the second clock pulse and the third clock pulse are neighboring clock pulses of the slow clock signal: the first clock pulse immediately precedes the second clock pulse, and the second clock pulse immediately precedes the third clock pulse.

14. The one or more computer-readable media recited in claim 11, wherein the first clock pulse and the second clock pulse are neighboring clock pulses of the slow clock signal: the first clock pulse immediately precedes the second clock pulse.

15. The one or more computer-readable media recited in claim 11, wherein the first circuitry comprises a first counter device, the first counter device being clocked by the slow clock signal and configured to change output when a number of clock pulses of the slow clock signal equals a first preset value, and the second circuitry comprises a second counter device, the second counter device being clocked by the slow clock signal and configured to change output when a number of clock pulses of the slow clock signal equals a second preset value.

16. The one or more computer-readable media recited in claim 15, wherein the first clock control device further comprises storage circuitry configured to store the first preset value and the second clock control device further comprises storage circuitry configured to store the second preset value.

17. The one or more computer-readable media recited in claim 11, wherein the first fast clock signal is a system clock signal for the first clock domain, the second fast clock signal is a system clock signal for the second clock domain, and the slow clock signal is used for scan shift.

18. The one or more computer-readable media recited in claim 11, wherein the test signal is a scan enable signal.

19. The one or more computer-readable media recited in claim 11, wherein frequency of the slow clock signal is determined based on time needed for cross-clock-domains signals travel from state elements in the first clock domain to state elements in the second clock domain.

20. The one or more computer-readable media recited in claim 11, wherein the first clock control device further comprises storage circuitry configured to store location information of the first clock pulse in the slow clock signal, and the second clock control device further comprises storage circuitry configured to store location information of the second clock pulse in the slow clock signal.

* * * * *